United States Patent [19]
Hennebois et al.

[11] Patent Number: 6,108,232
[45] Date of Patent: Aug. 22, 2000

[54] METHOD FOR THE ERASURE OF A STATIC RAM AND CORRESPONDING INTEGRATED CIRCUIT MEMORY

[75] Inventors: Brigitte Hennebois, Aix en Provence; Jean-Yves Monari, deceased, late of Marseille; by Serge Monari; Claudine Monari, heirs, both of Cruis; by Philippe Monari, heir, VilleFranche-sur-Mer, all of France

[73] Assignee: SGS-Thomson Microelectronics S.A., Gentilly, France

[21] Appl. No.: 09/032,630

[22] Filed: Feb. 27, 1998

[30] Foreign Application Priority Data

Feb. 28, 1997 [FR] France ................................. 97 02454

[51] Int. Cl.⁷ ...................................................... G11C 11/00
[52] U.S. Cl. ............................ 365/154; 365/194; 365/218
[58] Field of Search ..................................... 365/218, 154, 365/185.29, 194

[56] References Cited

U.S. PATENT DOCUMENTS

| | | | |
|---|---|---|---|
| 4,858,182 | 8/1989 | Pang et al. | 365/218 |
| 4,879,686 | 11/1989 | Suzuki et al. | 365/218 |
| 4,928,266 | 5/1990 | Abbott et al. | 365/189 |
| 4,949,308 | 8/1990 | Araki et al. | 365/218 |
| 5,054,000 | 10/1991 | Miyaji | 365/218 |

FOREIGN PATENT DOCUMENTS 0 642 131   3/1995   European Pat. Off. .......... G11C 7/00

OTHER PUBLICATIONS

French Search Report from French Patent Application 97 02454, filed Feb. 28, 1997.

*Primary Examiner*—Son T. Dinh
*Attorney, Agent, or Firm*—Wolf, Greenfield & Sacks, P.C.; James H. Morris; Theodore E. Galanthay

[57] ABSTRACT

In a static RAM, a complete erasure of the memory is achieved by sequentially propagating an erasure control signal from one group of memory cells to a next group of memory cells through delay circuits calibrated to correspond to a maximum time duration of erasure of the previous group of cells.

21 Claims, 3 Drawing Sheets

METHOD FOR THE ERASURE OF A STATIC RAM AND CORRESPONDING INTEGRATED CIRCUIT MEMORY

BACKGROUND OF THE INVENTION

1. Field of the Invention

The present invention relates to a method for the erasure of a static RAM and a corresponding integrated circuit memory.

2. Discussion of the Related Art

Static RAMs are used in many microprocessor-based applications, especially in data processing, to contain data elements on which computations or other processing operations are performed. RAMs are thus used to store data temporarily. When the power is turned off, they lose their contents, unless they have been associated with a back-up energy source (such as batteries or other energy cells).

Static RAMs are used in particular for smart card type products which are known to require a high level of security. These memories enable the application, in these products, of the different enciphering or other computations on confidential data elements stored therein.

It will be understood then that, to prevent any fraudulent use, it should not be possible to recover the data elements recorded in these static RAMs.

Now, even if these memories are "volatile", it cannot be certain that the data elements cannot be recovered when the power is turned off, for these data elements do not disappear instantaneously. There is a certain degree of remanence.

Thus, even if an anomaly is detected through various security sensors that may be planned and through associated security programs (such as voltage, frequency, temperature and passivation tests), the fact that the circuit has been turned off may not be enough to prevent the fraudulent recovery of sensitive data that has been stored in these memories.

Now, while it is possible for an external system to order the erasure of a static RAM by sending appropriate external control signals to the memory and by carrying out an address-by-address operation, this is a rather slow process, and resorting to security systems activated by external means is never satisfactory in terms of fraud control.

SUMMARY OF THE INVENTION

In the present invention, the idea has arisen of enabling total erasure of the memory internally.

According to the present invention, this erasure is a hardware erasure and not a software one, in order to provide maximum security. It is activated automatically, without any possibility of being stopped, by the detection of identified events such as the powering of the integrated circuit or the detection of an anomaly, thus ensuring the maximum security of said circuit and the data stored therein.

The total erasure may be obtained by selecting all the cells of the memory and activating transistors that draw the output towards the ground. However, it will be understood that, in practice, the current consumption induced by a total erasure operation of this kind raises problems. Indeed, a bit line of 128 static RAM cells may for example consume up to 25 milliamperes in erasure. If this figure is multiplied by the number of bit lines in the memory, the system may end up, in practice, with an unacceptable level of consumption depending on the total capacity of the memory. If the memory thus has a capacity of 2 Kbytes, it would be necessary to have about 2 amperes to carry out the instantaneous total erasure of the memory. This is not feasible.

To resolve this technical problem, the invention proposes an operation of sequential erasure of the memory. This is obtained by subdividing the memory into groups of memory cells and achieving the controlled propagation of an erasure signal from group to group. The erasure of a group of cells is then activated when the erasure of a preceding group of cells has ended. In this way, the current consumption is spread out over time.

The size of the group of cells depends on the organization of the memory array, its capacity and the permissible power consumption. The total erasure time necessary depends directly on the choice of this dimension which must be as small as possible to set a maximum limit on the period during which the data elements could still be read and recovered.

The smallest group that can be used easily is a bit line of the memory array or of the half-array when the memory array is organized into two half-arrays, all the word lines being selected. Depending on the memory capacity, the total erasure time and the permissible power consumption sought, the group may correspond to two or more bit lines, all of whose cells are selected simultaneously in order to be erased together.

The controlled propagation of the erasure signal is provided by a delaying circuit placed between each group of cells and the next one, and sized to provide a delay corresponding to the time taken to erase a group of cells. In this way, the current consumption is spread out over the entire period of erasure of the memory. At a given point in time, it is equal to the erasure current of a single group of cells.

In a method embodiment of erasing a static random access memory, the method comprises steps of: organizing the memory into groups of cells; and sequentially erasing each groups of cells of said memory in response to an erasure signal propagated in a controlled manner from group to group.

In a further embodiment, the step of controlled propagation includes imposing a determined delay between two successive groups of cells, the delay between the two successive groups being at least equal to a maximum duration of erasure of the first group.

In another embodiment, a method of erasing a static RAM, the RAM including a plurality of memory cells arranged in a matrix format including at least one bit line and at least one word line, includes steps of: (a) generating a start erase signal; (b) enabling all word lines at once in response to the generated start erase signal; (c) erasing all memory cells coupled to a first bit line of the at least one bit line in response to the generated start erase signal; (d) delaying a predetermined amount of time; and (e) erasing all memory cells coupled to a second bit line of the at least one bit line after the delay in step (d).

In yet another embodiment, a method of erasing a static RAM, the RAM including a plurality of memory cells arranged in a matrix format including at least one bit line and at least one word line, includes steps of: (a) generating a start erase signal; (b) erasing all memory cells in a first group of memory cells; (c) delaying a predetermined amount of time; and (d) after the predetermined amount of time, erasing all memory cells in a second group of memory cells.

BRIEF DESCRIPTION OF THE DRAWINGS

Other features and advantages of the present invention are described in detail in the following description, given by way of a non-restrictive example with reference to the appended drawings, of which.

DETAILED DESCRIPTION

Figure 1:
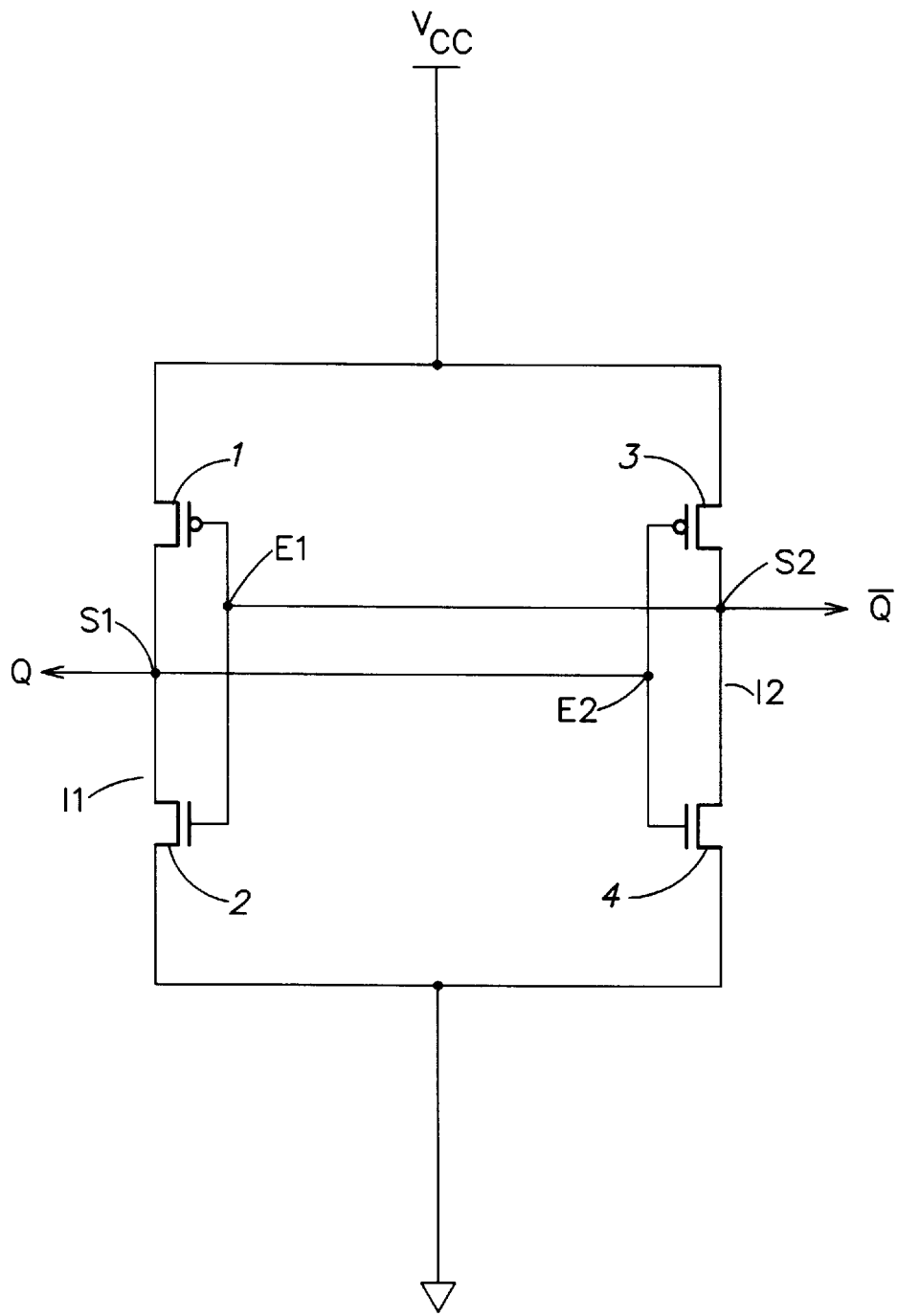
FIG. 1 shows an exemplary embodiment of a static RAM implemented with CMOS technology.

FIG. 1 shows a static RAM cell using CMOS technology. This cell conventionally includes two looped inverters I1 and I2 with complementary transistors.

The first inverter I1 includes a P-type MOS transistor 1 series-connected with an N-type MOS transistor 2 whose gates, connected together, form an input E1 of the inverter and whose drains, connected together, form an output S1 of the inverter I1.

The second inverter I2 comprises a P-type MOS transistor 3 and an N-type MOS transistor 4 whose gates, connected together, form an input E2 of the inverter and whose drains, connected together, form an output S2 of the inverter I2.

The output S1 of the first inverter I1 is connected to the input E2 of the second inverter I2 and forms the terminal Q of the memory cell. The output S2 of the second inverter I2 is connected to the input E1 of the first inverter I1 and forms the terminal/Q of the memory cell.

The working of a memory cell of this kind is well known. To write a data element ("0" or "1"), the information to be written is presented at the terminal Q of the cell, namely at the input E2 of the second inverter I2 and the output S1 of the first inverter I1. The second inverter I2 is sized so as to swiftly follow the input level. Its output S2, applied to the input E1 of the first inverter, enables the inverter I1 to sustain its output level S1 and it is sized to maintain this output level. To read the information contained in the memory cell, a selection is made, in the example, of the two terminals Q and/Q of the cell to transmit the information contained and its complementary information toward an output amplifier circuit.

Figure 2:
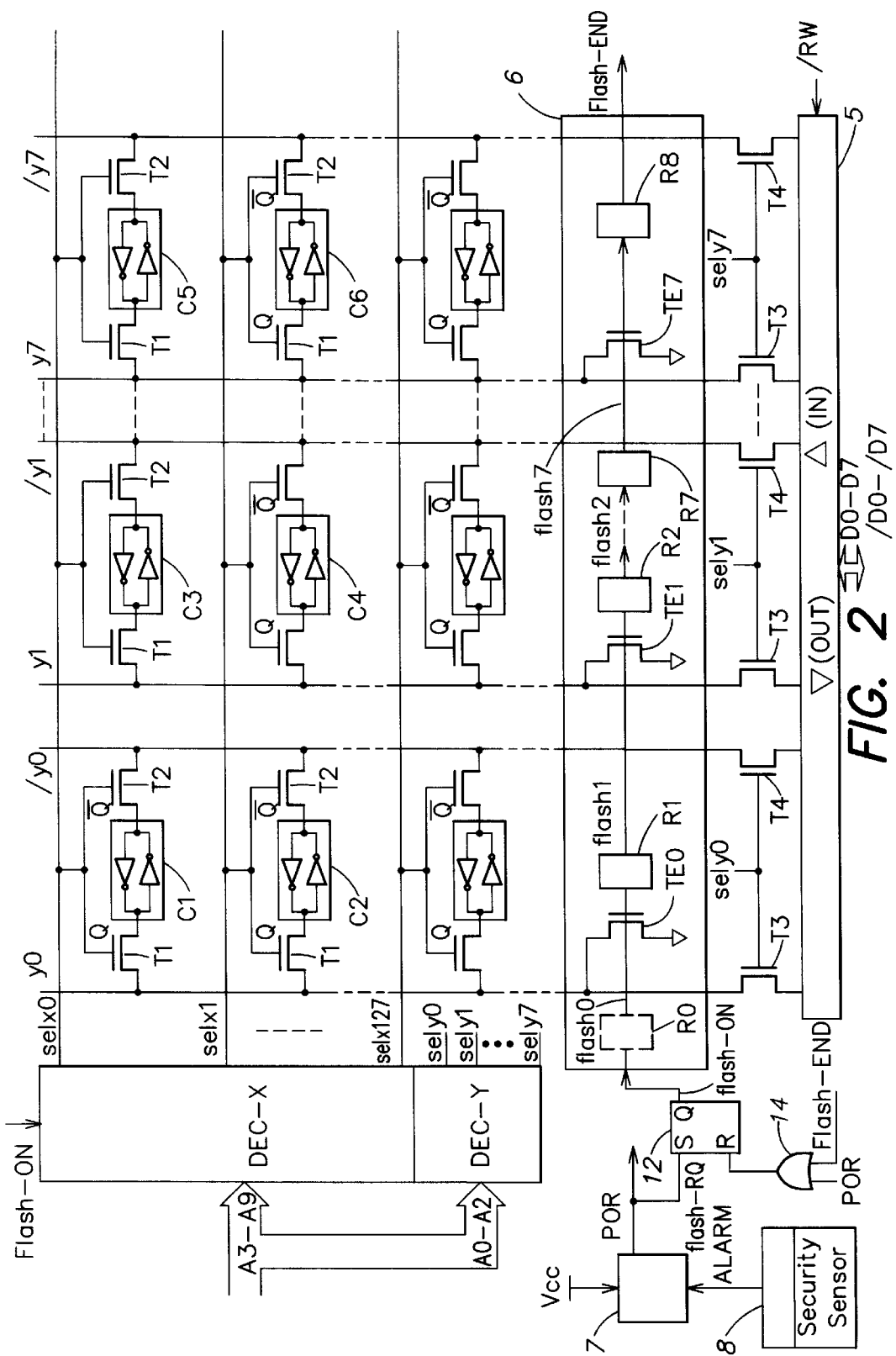
FIG. 2 shows a corresponding example of the organization of a static RAM with a schematic view of an embodiment of a sequential erasure circuit according to the present invention.

An exemplary organization of a static RAM is shown in FIG. 2. This is a matrix organization including bit lines (y0 to y7) and word lines (selx0 to selx127). The memory cells C1, C2, . . . are represented schematically by two looped inverters.

A selection transistor T1 is connected between the terminal Q of each cell, for example C1, and the associated bit line, y0 in the example. This selection transistor T1 is controlled at its gate by the associated word line selection signal, selx0 in the example. When this selection signal selx0 is activated (in the example when it is at "1"), all the cells associated with this word line send the level of their terminal Q to the associated bit line.

In the example shown, there is a second selection transistor T2 connected between the terminal/Q of each cell and the corresponding complementary bit line/y0. Each bit line y0 and each complementary bit line/y0 is connected to a read/write circuit 5 by an associated selection transistor referenced T3 for the bit line y0 and T4 for the complementary bit line/y0. The transistors T3, T4 are activated at their respective gates by a corresponding bit line selection signal sely0 for the lines y0 and/y0, sely1 for the lines y1 and/y1, . . . , sely7 for the lines y7 and/y7.

The read/write circuit 5 is connected to the data input/output bus D0–D7 and/D0–/D7 in the example.

The word line selection signal and bit line selection signal are provided, respectively, by a word line decoder DEC-X and a bit line decoder DEC-Y. In normal operation, these decoders enable the selection of a word line and one or more bit lines for reading, writing or erasing an information word. The supply voltage Vdd of the circuit is then on the selected word line (selx0 for example).

The represented architecture is simple but sufficient to explain the principle of the invention. Other standard types of architecture are possible, however, especially those where the memory array is divided into two half-arrays.

According to the present invention, the memory additionally includes a circuit 6 to erase all the memory cells upon activation of an internally generated erasure control signal flash-ON.

This erasure circuit 6 includes one erasure transistor per group of cells to be erased and delay circuits in series on a line for the propagation of the erasure control signal flash-ON, the delay circuits being placed between the respective erasure transistors of two groups of cells to be erased.

In the example, a group of cells corresponds to a bit line. The selection of a particular group of cells is then obtained by selecting the corresponding bit line, all the word lines being selected beforehand.

To enable the simultaneous selection of all the word lines, a circuit is provided in the word line decoder DEC-X, enabling this simultaneous comprehensive selection upon activation of a control signal which may, for example, be the flash-ON erasure control signal. The decoder DEC-X may for example, include logic circuits capable of imposing an active state on all the word lines when the control signal flash-ON is in the active state (1, in the example), the address signals of the address bus being then ignored.

For the selection of a bit line in erasure mode, there is provided an erasure transistor connected between each bit line and ground, said erasure transistor being controlled at its gate by an output of a delay circuit positioned upline with respect to the bit line. The erasure transistor of the first bit line y0 to be erased, transistor TE0 in the example, may itself be controlled directly by the erasure control signal flash-ON or by a delay circuit placed upline, referenced R0 in the example and shown in dashes in FIG. 2.

The other erasure transistors, TE1 to TE7 in the example, are respectively controlled at their gates by the respective outputs flash1 to flash7 of the delay circuits R1 to R7, each delay circuit positioned upline with respect to the corresponding erasure transistor.

Thus, each erasure transistor TE0 . . . TE7 is activated successively when the erasure of the previous group of cells is ended. The delay circuits are sized to introduce a delay corresponding to a maximum time needed for the erasure of the previous group of memory cells. In practice, the erasure signal is propagated from the first bit line to the last one and, if necessary, from the first half-array to the second one to obtain the total erasure of the memory.

Preferably, the groups of cells are all equivalent (namely they include the same number of memory cells) and the delay circuits are all identical.

Although it is not necessary to the implementation of the sequential erasure according to the present invention, the delay circuit R0 associated with the first group of cells (line y0) can be used to obtain an identical structure for all the groups of cells. Thus there is the same load everywhere. This is preferable. For these same reasons and also for the simplicity of the implementation that results therefrom, the groups of cells according to the invention preferably include the same number of memory cells.

It should be noted that, so long as the erasure control signal is active, all the activated erasure transistors remain active even if they no longer consume any current, once the erasure of their associated group of cells is achieved. The signal flash-ON could be a signal corresponding at least to the period of erasure of a group of cells, with delay circuits adapted for the propagation of this pulse without deformation.

However, it is preferable that the end of the active level of the signal flash-ON should be generated once the entire memory has been erased, namely after the erasure of the last group of cells.

Thus, there is provision for a last delay circuit R8 located downline from the last group of cells to be erased, to provide an end-of-erasure control signal flash-END that enables the deactivation of the erasure control signal flash-ON.

This principle provides for very sure erasure, especially suited to the security requirements of "smart card" type applications.

The delay circuits R0 ... R8 are sized to take account of the variations due to temperature, supply voltage or dispersion of characteristics, so that the delay that they induce is always greater than the time of erasure of a group of cells.

The erasure control signal flash-ON is generated upon the detection of well-defined events. In practice, the powering of the memory circuit or the detection of anomalies by a circuit for the management of security sensors leads to the generation of this signal flash-ON as shown in FIG. 2. The signal flash-ON is generated from a circuit 7 for the powering of the memory circuit which, upon the detection of a voltage buildup (at the terminal Vcc) or the reception of an alarm signal (ALARM) from the sensor management circuit 8, generates a memory circuit power-on reset signal POR. This signal (or its reverse according to its active state) is used to generate a pulse signal referenced flash-RQ, applied to the one-setting input (S) of an RS flip-flop circuit 12. When the signal flash-RQ shows a leading pulse edge, the output Q goes to one. This output Q is used as the erasure control signal flash-ON. The signal flash-RQ makes it go to its active state.

The signal flash-END for its part is applied to the zero-setting input of the RS flip-flop 12 circuit to make the signal flash-ON go back to its passive level. Preferably, it is provided that the flip-flop circuit 12 may be reset by the power-on reset signal POR. In practice, there is provision for an OR gate 14 that receives, as inputs, the signals POR and flash-END, the output of this OR gate 14 being applied to the zero-setting input (R) of the flip-flop circuit 12.

Other embodiments are of course possible, especially as a function of the architecture of the memory circuit to which the invention is to be applied.

Figure 3:
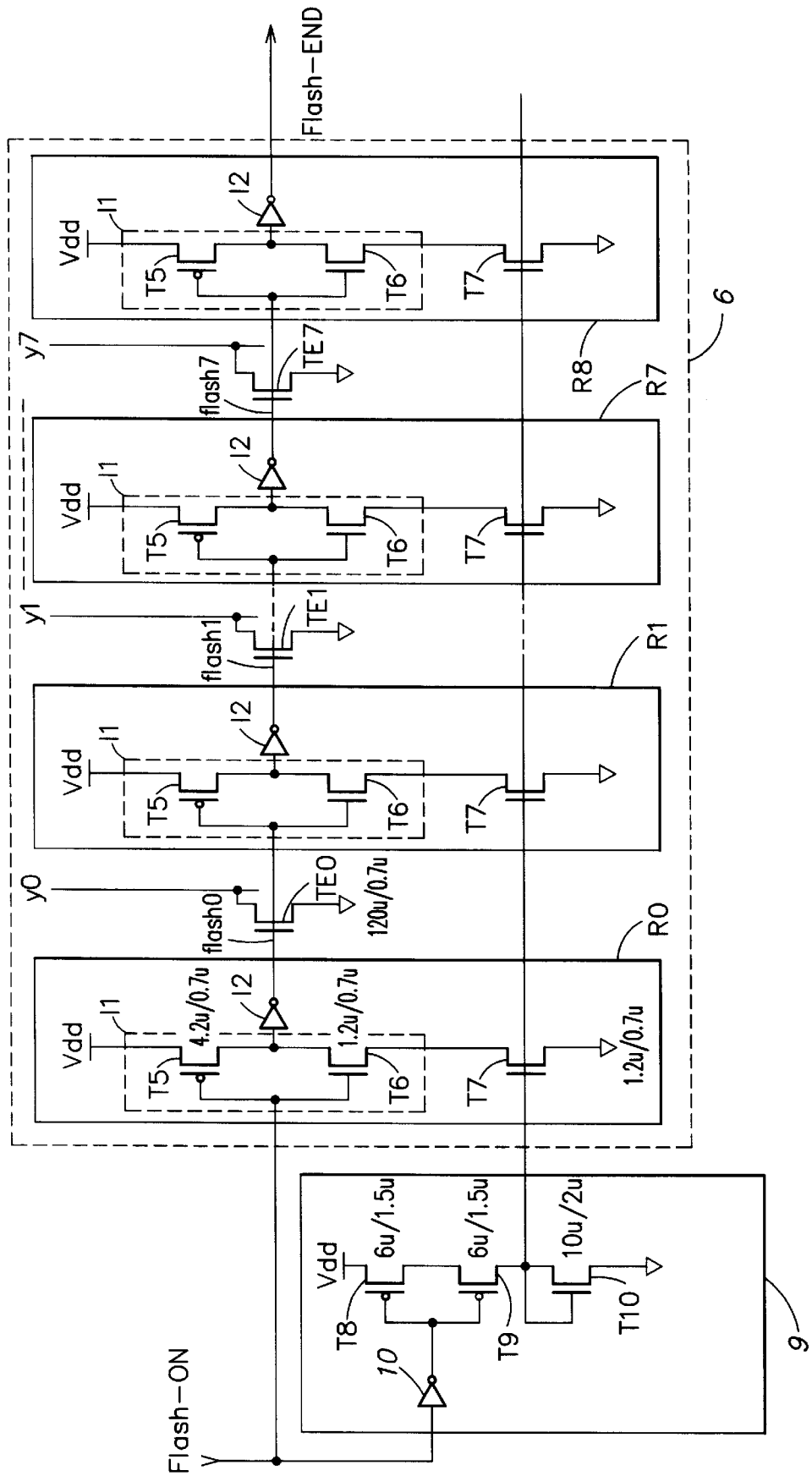
FIG. 3 shows an exemplary practical embodiment in a static RAM to implement the method of erasure according to the present invention.

FIG. 3 gives a detailed view of an exemplary erasure circuit 6 for the propagation of the erasure control signal flash-ON and for the generation of the end-of-erasure control signal flash-END.

The erasure circuit 6 includes one delay circuit R per group of cells so as to propagate the erasure control signal flash-ON from group to group and one additional delay circuit after the last group of cells to generate the end-of-erasure signal flash-END.

Each delay circuit, in the example, has a first CMOS inverter I1 including a first P-type MOS transistor T5 and a second N-type MOS transistor T6 whose gates connected together form the output, with the source of the transistor T6 being connected to ground by an N-type MOS transistor T7 which is of the same N-type as transistor T6 to impose a calibrated current in the arm and thus delay a switch-over of the inverter in a controlled manner.

The first inverter I1 is followed by a second inverter I2 to give the polarity of the input signal.

The load transistors T7 of the delay circuits are each biased by a single biasing circuit 9. In the example, this biasing circuit 9 is a current mirror circuit activated by the control signal flash-ON. It includes an inverter 10 to control the gates of two P-type transistors T8 and T9 series-connected between the supply voltage and the drain of an N-type MOS transistor T10 having its gate connected to its drain and its gate connected to the gate of each load transistor T7. The determined current flowing in the bias arm is thus copied in the arm of each delay circuit. This current is a function of the characteristics of the arm of the bias circuit, namely the geometries of the transistors and their type, i.e., whether enhanced or depleted. The bias circuit 9 is thus sized as a function of the minimum delay that is required between each group of cells. It therefore depends on the technological characteristics of the cells of the memory considered.

It has already been indicated that the delay circuit R0 for the erasure of the first group is not obligatory in principle. It can be used to have an identity of structure for all the groups of cells of the memory, which is the condition preferably sought. However, in the circuits where it is sought to minimize the number of elements to the greatest extent possible (in order to gain space) or else for which it is sought to obtain the shortest possible total erasure time, this delay circuit R0 can be eliminated.

The delay circuit R8 for the generation of the end-of-erasure control signal is valid for a signal flash-ON that remains at the active level so long as no action is taken to make it go back to its passive level. It is not necessary if the signal chosen is a pulse type signal flash-ON with a calibrated duration corresponding to the maximum duration of erasure of a group of cells, although this choice results in propagation circuitry of greater complexity.

Preferably, the delay circuits use a P-type transistor T5 in the inverter for the switch-over of the output from the low level to the high level because, under these conditions, a transistor of this kind switches over at a higher speed, making it possible to stop the erasure as swiftly as possible.

In practice, if there is one 128-cell bit line per group to be erased, the N-type erasure transistor will have dimensions W/L in the range of 120 $\mu$m/0.7 $\mu$m in CMOS technology to 0.7 $\mu$m to be capable of letting through a maximum current of 25 milliamperes according to experimental results.

A bit line is then discharged in a maximum time of 3 nanoseconds at a supply voltage of 5.5 volts and a maximum time of 25 nanoseconds at a supply voltage of 1.8 volts. With a supply of 5.5 volts, the delay circuits are sized so that the delay induced is in the range of 4 nanoseconds.

For 16 cells, the maximum current falls to 15 milliamperes and an N-type MOS transistor with dimensions (W/L) of 15 $\mu$m/0.7 $\mu$m becomes sufficient. In the exemplary embodiment described with reference to FIGS. 2 and 3, it is the MOS technology that is chosen. But, as is clear to one of ordinary skill, the invention can be implemented with any technology.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A static random access memory in integrated circuit form subdivided into at least one group of cells, the static RAM comprising:

one erasure transistor and delay circuit per at least one group of cells, each erasure transistor being controlled at its gate by an erasure signal that is propagated from gate to gate through the delay circuit, wherein at least one delay circuit comprises an inverter and current limiter assembly, and wherein the current limiter of each delay circuit is controlled by a single current mirror bias circuit so as to impose a same current in an output arm of the inverter.

2. The static random access memory according to claim 1, further comprising a last delay circuit after the gate of the erasure transistor of a last group of memory cells to be erased, the last delay circuit to generate an end-of-erasure control signal.

3. The static random access memory according to claim 1, wherein each group of cells include a same number of cells.

4. The static random access memory according to claim 1, wherein each delay circuit dictates a propagation time of the erasure signal between the gates of two successive erasure transistors to be at least equal to a maximum time duration of erasure of the group of cells connected to the first of the two erasure transistors.

5. A method of erasing a static random access memory including a plurality of memory cells arranged in a matrix format including one or several bit lines and at least one word line, the method including steps of:

(a) forming groups of cells, each group of cells comprising at least one bit line;

(b) generating a start erase signal;

(c) enabling all word lines at once in response to the generated start erase signal;

(d) erasing all memory cells in a first group in response to the generated start erase signal;

(e) delaying a predetermined amount of time after generating the start erase signal; and (f) erasing all memory cells in a second group after the delay in step (d);

wherein step (b) comprises a step of:

detecting a fraudulent attempt to access information stored in the static random access memory.

6. The method as recited in claim 5, wherein step (d) includes delaying the predetermined amount of time prior to erasing all memory cells in the first group.

7. The method as recited in claim 5, wherein the predetermined amount of time has a duration longer than a time duration needed to erase all the memory cells in the first group.

8. The method as recited in claim 5, further comprising a step of:

terminating the generation of the start erase signal after the memory cells in a last group in the memory have been erased.

9. A method of erasing a static random access memory including a plurality of memory cells arranged in a matrix format including at least one bit line and at least one word line, the method including steps of:

(a) generating a start erase signal;

(b) enabling all word lines at once in response to the generated start erase signal;

(c) erasing all memory cells coupled to a first bit line of the at least one bit line in response to the generated start erase signal;

(d) delaying a predetermined amount of time; and (e) erasing all memory cells coupled to a second bit line of the at least one bit line after the delay in step (d), wherein step (a) includes a step of:

detecting a fraudulent attempt to access information stored in the static random access memory.

10. The method as recited in claim 9, wherein the detecting step includes:

detecting at least one of voltage, frequency, temperature and passivation characteristics.

11. A method of erasing a static random access memory including a plurality of memory cells arranged in a matrix format including at least one bit line and at least one word line, the method including steps of:

(a) generating a start erase signal;

(b) erasing all memory cells in a first group of memory cells;

(c) delaying a predetermined amount of time; and (d) after the predetermined amount of time, erasing all memory cells in a second group of memory cells, wherein step (a) includes a step of:

detecting a fraudulent attempt to access information stored in the static random access memory.

12. An apparatus for erasing a memory including a plurality of memory cells arranged in a matrix format including at least one bit line and at least one word line, the apparatus comprising:

a word line decoder circuit coupled to the at least one word line;

an erasure circuit coupled to the at least one bit lines to erase a first group of memory cells and, after a predetermined delay, erase a second group of memory cells; and a security sensing circuit, coupled to the word line decoder and erasure circuits, to generate a start erase signal upon a detection of a fraudulent attempt to access data in the memory;

the word line decoder including circuitry to enable all word lines upon receipt of the start erase signal; and the erasure circuit including circuitry to erase the first group of memory cells coupled to a first bit line separately from the second group of memory cells coupled to a second bit line.

13. The apparatus as recited in claim 12, wherein the erasure circuit further comprises:

a first erasure transistor having a first terminal coupled to the first bit line, a second terminal coupled to a first reference lead and a control terminal coupled to receive the start erase signal;

a second erasure transistor having a first terminal coupled to the second bit line, a second terminal coupled to the first reference lead, and a control terminal; and a delay circuit coupled between the control terminal of the first transistor and the control terminal of the second transistor, the delay circuit to delay transmission of the start erase signal from the first transistor to the second transistor by the predetermined delay.

14. The apparatus as recited in claim 13, wherein the predetermined delay has a duration at least as long as a time duration needed to erase all memory cells in the first group.

15. The apparatus as recited in claim 13, wherein the delay circuit comprises:

a first delay transistor;

a second delay transistor; and a third delay transistor;

wherein the first, second and third delay transistors are coupled in series between a supply reference lead and the first reference lead, a control terminal of the first delay transistor connected to a control terminal of the second delay transistor at a first node to receive the start erase signal, a first terminal of the first delay transistor connected to a first terminal of the second delay transistor at a second mode to output a delayed start erase signal; and the third delay transistor is biased to provide a constant current through the first, second and third delay transistors.

16. The apparatus as recited in claim 15, wherein:

the first delay transistor is of a first type; and the second and third delay transistor are each of a second type different from the first type.

17. The static random access memory according to claim 1, wherein each at least one group of cells comprises those cells coupled to a specific bit line.

18. The method as recited in claim 9, further comprising a step of:

forming groups of cells, each group of cells comprising at least one bit line.

19. The method as recited in claim 9, wherein step (c) comprises:

delaying the predetermined amount of time prior to erasing all memory cells coupled to the first bit line of the at least one bit line.

20. The method as recited in claim 9, wherein the predetermined amount of time has a duration longer than a time duration needed to erase all the memory cells coupled to the first bit line.

21. The method as recited in claim 9, further comprising a step of:

terminating the generation of the start erase signal after all memory cells coupled to a last bit line of the at least one bit line have been erased.

* * * * *